(12) United States Patent
Thiesfeld et al.

(10) Patent No.: US 9,116,619 B2
(45) Date of Patent: Aug. 25, 2015

(54) DISPLAYING STORAGE DEVICE STATUS CONDITIONS USING MULTI-COLOR LIGHT EMITTING DIODE

(71) Applicant: Seagate Technology LLC, Cupertino, CA (US)

(72) Inventors: Charles W. Thiesfeld, Lakeville, MN (US); Michael H. Miller, Eden Prairie, MN (US); Richard Esten Bohn, Shakopee, MN (US); Sumanth Jannyavula Venkata, Shakopee, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 161 days.

(21) Appl. No.: 13/891,388

(22) Filed: May 10, 2013

(65) Prior Publication Data

US 2014/0333449 A1 Nov. 13, 2014

(51) Int. Cl.
G08B 5/22 (2006.01)
G06F 3/06 (2006.01)
G11C 16/20 (2006.01)
G11C 29/44 (2006.01)

(52) U.S. Cl.
CPC *G06F 3/06* (2013.01); *G11C 16/20* (2013.01); *G11C 2029/4402* (2013.01)

(58) Field of Classification Search
CPC ....... G06F 3/06; G09F 9/33; G09F 2013/222; G11C 16/20; G11C 2029/4402; G11C 29/44
USPC ............... 340/815.45, 815.4, 815.43, 815.56, 340/653, 540, 815.66, 635; 711/103; 315/297; 365/185.33, 228
See application file for complete search history.

(56) References Cited

U.S. PATENT DOCUMENTS

| | | | |
|---|---|---|---|
| 4,550,287 A | 10/1985 | Babcock | |
| 5,646,535 A | 7/1997 | Dornier | |
| 6,774,767 B2 * | 8/2004 | Hooks et al. | 340/286.02 |
| 8,223,015 B2 * | 7/2012 | Yuuki | 340/540 |
| 8,310,373 B2 | 11/2012 | Feight et al. | |
| 8,362,705 B2 | 1/2013 | Mills et al. | |
| 2009/0051558 A1 * | 2/2009 | Dorval | 340/653 |
| 2009/0237006 A1 * | 9/2009 | Champion et al. | 315/297 |
| 2012/0309211 A1 | 12/2012 | Jacks et al. | |
| 2014/0164678 A1 * | 6/2014 | Lan et al. | 711/103 |

* cited by examiner

*Primary Examiner* — Anh V La
(74) *Attorney, Agent, or Firm* — Hollingsworth Davis, LLC

(57) ABSTRACT

Displaying storage device status conditions using multi-color light emitting diodes (LEDs) involves monitoring values of a status condition of at least one persistent storage device. The values are mapped to two or more colors, and at least one multi-color LED displays the two or more colors in response to the respective values.

20 Claims, 4 Drawing Sheets

DISPLAYING STORAGE DEVICE STATUS CONDITIONS USING MULTI-COLOR LIGHT EMITTING DIODE

SUMMARY

The present disclosure is related to displaying storage device status conditions using multi-color light emitting diodes (LEDs). One example embodiment involves monitoring values of a status condition of at least one persistent storage device. The values are mapped to two or more colors, and at least one multi-color LED displays the two or more colors in response to the respective values.

Another example embodiment involves monitoring status conditions of at least one persistent storage device. The status conditions are mapped to respective sequences. Each sequence includes two or more states each having a display duration and a color mapped to a monitored value of one of the status conditions. At least one multi-color LED displays the sequences in response to the respective status conditions.

These and other features and aspects of various embodiments may be understood in view of the following detailed discussion and accompanying drawings.

BRIEF DESCRIPTION OF THE DRAWINGS

In the following diagrams, the same reference numbers may be used to identify similar/same components in multiple figures.

DETAILED DESCRIPTION

Figure 1:
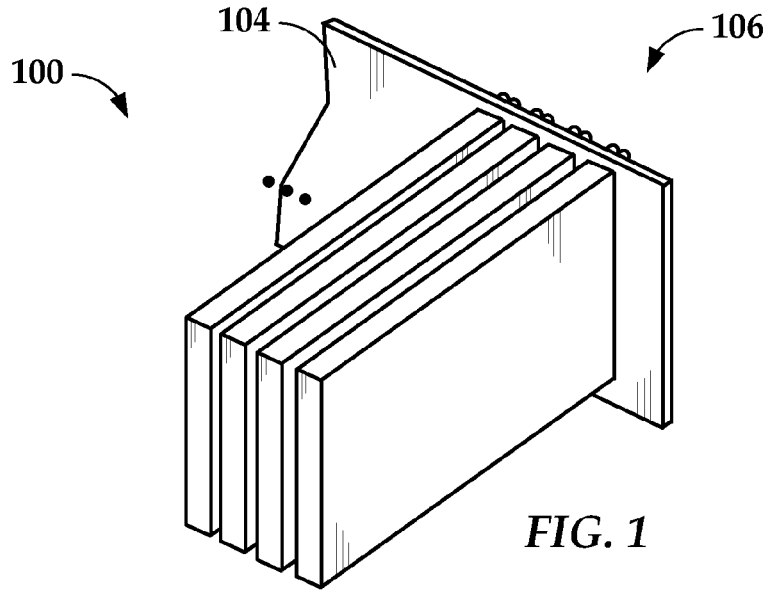
FIG. 1 is an isometric view of an apparatus according to an example embodiment.

This disclosure generally relates to a providing user feedback regarding activity and/or status in a system of one or more storage data processing drives. Storage systems of this type, referred to herein as "multi-drive systems," may employ an array of hard drives (e.g., two or more) in a single enclosure. For purposes of this disclosure, the term "hard drive" or "storage device" refers to any modular persistent storage device that includes a common mechanical, data, and power interface, and may include magnetic hard disks, solid-state drives, hybrid drives, optical data storage devices, etc.

Some multi-drive systems may include, for each hard drive, a green activity LED that blinks when the hard drive is performing activity (e.g., reading, writing). Each drive may also have a second, red LED that is illuminated when the associated drive fails and needs replacement or service. The LEDs in such an arrangement may be placed on a back panel or backplane, and light from the LEDs is directed to the front side by a "light pipe" (e.g., optic fiber or transparent plastic structure) so that the LED output can be viewed by a system operator.

A single-color LED indicator system may generally indicate a failure without providing any indication of the cause of the failure, and such a system may not provide warning of degraded operation before the failure occurs. The storage systems of today are becoming more sophisticated, and so there may be a need to provide better indicators of activity levels and/or status conditions of the storage device.

To provide enhanced device status indications, the systems described herein utilize one or more multi-color LEDs (e.g., tri-color LED) for each storage device. In some configurations, the LEDs may be attached to a front panel and directly visible to the operator. In other configurations, the LEDs are attached to a back panel and directed to the front panel via fiber optics or other optical carrying device. Two LEDs per storage device may be used. In such a case, one LED may provide feedback of subsystem activity of the storage device and the other LED may be controlled by management software that reports activity related to the storage device's functional status.

A system according to example embodiments may include a hardware or software driver that modulates a cycle of colors of the LED such that the hue and intensity of the LED can be varied like a pixel of a color display. Another layer of the system may monitor various operating conditions such as junction temperature, percentage of central processing unit (CPU) usage, interface activity, type of processing tasks, cache depth, or other items that may be of interest to a system operator. Another layer may be used to associate or map the conditions with sets of colors. A management layer may be used mix the colors into a pattern to be presented.

From the front of the storage device, an array of the LEDs will be visible and patterns of flashing colors will be noticeable by a human observer. When all devices are performing similar functions they should have similar flashing patterns. If one device is behaving differently from the others, its pattern will stand out as unique. As all the devices proceeds through sequences of operations, the observer will learn which patterns correspond to particular steps of the operation and identify progress (or lack thereof). Such information qualitatively indicates status, and need not be quantitatively precise. When monitoring large arrays, qualitative data may provide sufficient data to indicate status to an operator, and other tools may be used to investigate further if a problem is noticed.

In reference now to FIG. 1, an isometric view shows a multi-drive system 100 according to an example embodiment. The multi-drive system 100 includes a plurality of storage devices 102 coupled to a junction board 104. The junction board 104 may include a backplane, front plane, motherboard, daughter card, peripheral card, etc. The storage devices 102 may be physically coupled to the junction board 104, e.g., via on-board connectors, mounting brackets/slides, etc. In another arrangement, the storage device 102 may be physically attached elsewhere and electrically coupled to the junction board 104, e.g., via cables.

The junction board 104 includes a plurality of LEDs 106 that are directly visible to an operator (e.g., front panel mounted), or made visible via fiber optics or some other optical carrier. Each of the LEDs 106 may be an individual package, e.g., a transparent or translucent case that includes one or more semiconductor illuminating elements. Such an LED package generally includes terminals for electrical coupling, e.g., soldered to a circuit board, wires, etc. At least one LED is associated with each storage device 102. The junction board 104 (and/or another system component) may also include circuitry and/or software that facilitate controlling the LEDs 106 in response to activity and/or status of the storage devices 102. An example embodiment of this control circuitry and/or software is shown in the block diagram of FIG. 2.

Figure 2:
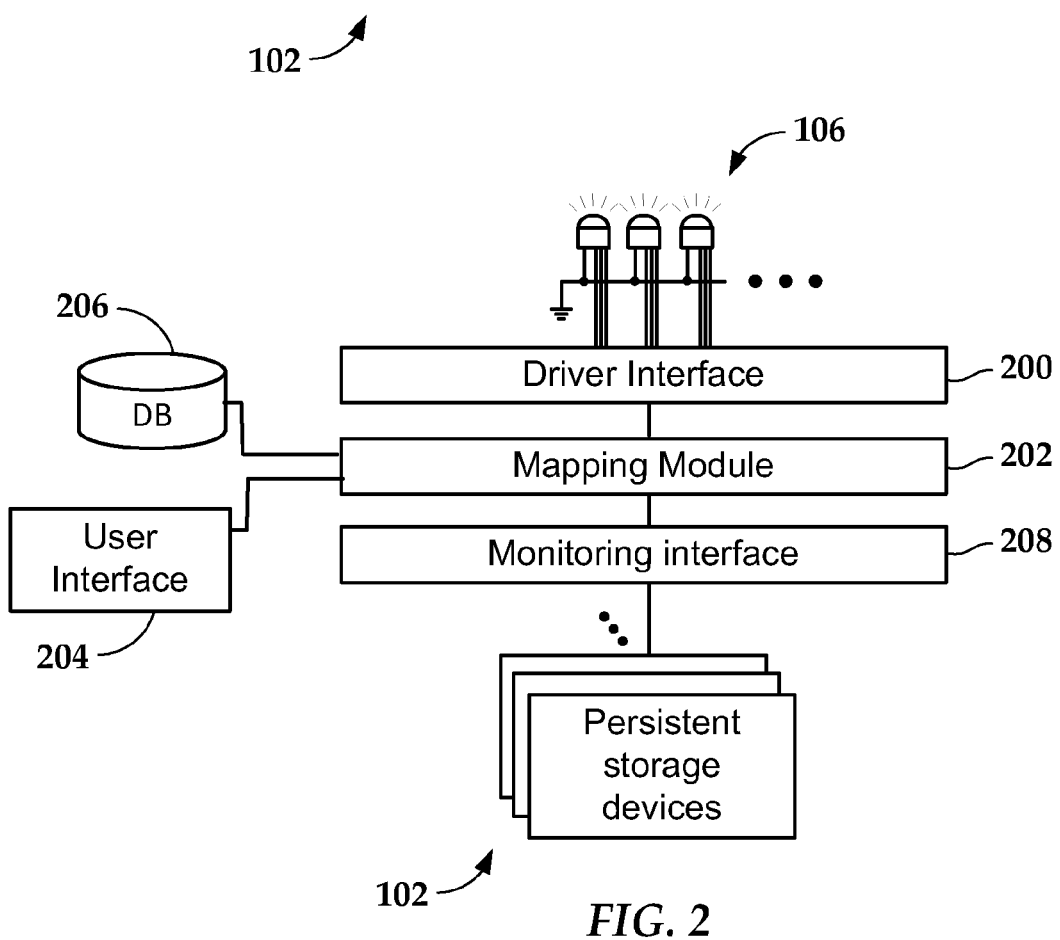
FIG. 2 is a block diagram of control circuitry according to an example embodiment.

In FIG. 2, a driver interface 200 may include one or more of circuitry, firmware, and software to control activation, intensity, and color of the array of LEDs 106. For example, the driver interface 200 may include biasing circuits to control currents that cause illumination of the LEDs 106. The biasing circuits may adjust a magnitude of the currents to control an intensity level of the illumination. In other configurations, the LEDs may use pulse width modulation to control intensity.

The driver interface 200 may include color selection circuits that select from multiple color lines of the LEDs 106. For example, the LEDs 106 may have one line each for red, green, and blue. In one configuration, at least some of the LEDs 106 may be multi-color LEDs that display a different color depending on the polarity of the applied voltage to at least one set of lines. In such a configuration, the driver interface 200 may include a polarity control to select between the two different colors by applying a different polarity to at least one line.

Each of the LEDs 106 is associated with one of the plurality of storage devices 102. The association between a particular one of the LEDs 106 and a particular one of the storage devices 102 may be predetermined by the physical and logical connections within the multi-storage device. For example, storage devices 102 may be plugged into data interface ports numbered 0-n, and a similar numbering scheme used to identify the LEDs 106. There may be two or more LEDs associated with each of the storage devices 102, and so LEDs associated with the device at port 0 may be annotated, for example, LED 0A and 0B.

A mapping module 202 may be able to define and alter the association between LEDs 106 and storage devices 102. For example, if storage devices 0, 2, and 4 are combined into a redundant array of independent disks (RAID) and storage devices 1, 3, and 5 are combined into another RAID, then the operator might want to group LEDs associated with each RAID physically adjacent to one another. In such an example, devices 0, 2, and 4 could be mapped to LEDs 0-2, and devices 1, 3, and 5 could be mapped to LEDs 3-5.

The mapping module 202 may allow the user to define states that include colors and/or timing intervals for each of the LEDs 106 or groups thereof. The mapping module 202 may further allow the user to map the colors and/or timing intervals to particular status conditions (e.g., states, activities, measurements, etc.), of the associated storage devices 102. The mapping module 202 may provide or utilize a user interface 204 that facilitates user selection of the mappings. User-defined data describing the mappings can be stored in a persistent database 206.

A monitoring interface 208 is coupled to storage devices 102 and other components to collect data from the storage devices 102, e.g., by monitoring peripheral bus traffic, collection of data from software or firmware drivers, monitoring power supply interfaces, monitoring external instruments (e.g., temperature monitors), etc. The monitoring interface 208 may control the LEDs 106 via the driver interface 200. In such a case, the monitoring interface 208 may be configured to look up current mapping data from the mapping module 202. The mapping data may include just user-defined endpoints for a given status condition, in which case the monitoring interface 208 uses the endpoints and a current status condition to derive the desired color. In another configuration, the mapping module 202 may derive the color, e.g., via a function that returns a color based on a value of a status condition. For purposes of this disclosure, "mapping" may involve both the user-defined assignment of endpoint colors to particular status values and the derivation of intermediate colors based on measured/monitored values.

In another configuration, the mapping module 202 may control the LEDs 106 via the driver interface 200 in response to events and measurements detected by the monitoring interface 208. In this case, the mapping module 202 may dynamically determine an appropriate color value of the LED, e.g., based on user selected endpoints and interpolating based on a status condition value determined from the monitoring interface 208.

Figure 3:
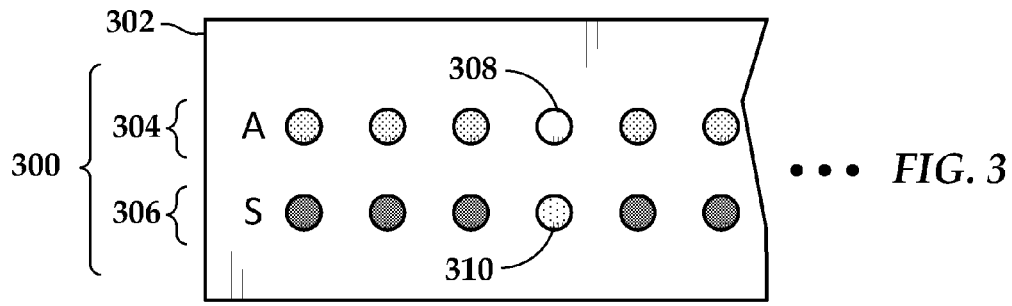
FIG. 3 is a front view of a panel having an array of indicators according to an example embodiment.

In FIG. 3, a front view of a display panel 302 illustrates an array of indicators 300 according to an example embodiment. It will be understood that the illustrated arrangement of indicators 300 is for purpose of example, and any placement and arrangement of indicators (e.g., two columns, diagonals, concentric circles, etc.) may be used. Different shading of the indicators 300 is meant to indicate different colors and/or intensities. The indicators 300 may be LEDs as previously described, or may be endpoints of light carriers that are optically coupled to LEDs.

The indicators 300 are arranged into two groups 304, 306. The first group 304 is labeled with an 'A,' indicating these are activity indicators. The second group 306 is labeled 'S,' indicating these are status indicators. There may be number of ways to define what information is considered as "activity" and what is considered as "status."

In some cases, activity may be considered to have a higher time rate of change than status. In other cases, the distinction between activity and status may be based on how or where the data is collected, e.g., via a host, peripheral bus interface, hard drive host interface, controller board management software, host drivers, etc. The distinction between activity and status on the display panel 302 may be somewhat arbitrary because, as will be described below, the user may able to make any desired mapping of status conditions to indicators regardless of how the indicators 300 are labeled on the panel 302.

The indicators 300 may display a synchronized set of sequences so that a differently behaving one of the persistent storage devices can be visually distinguished from others of the array. A difference in activity and/or status of one storage device (e.g., indicated by different shading of example indicators 308, 310) may be readily apparent if the other devices in the array are acting similarly, e.g., showing similar colors, color change patterns, etc. The colors shown by indicators 308, 310 are different than other indicators 300, and so may be hinting at trouble, even if the storage device associated with indicators 308, 310 is still operational.

Figure 4:
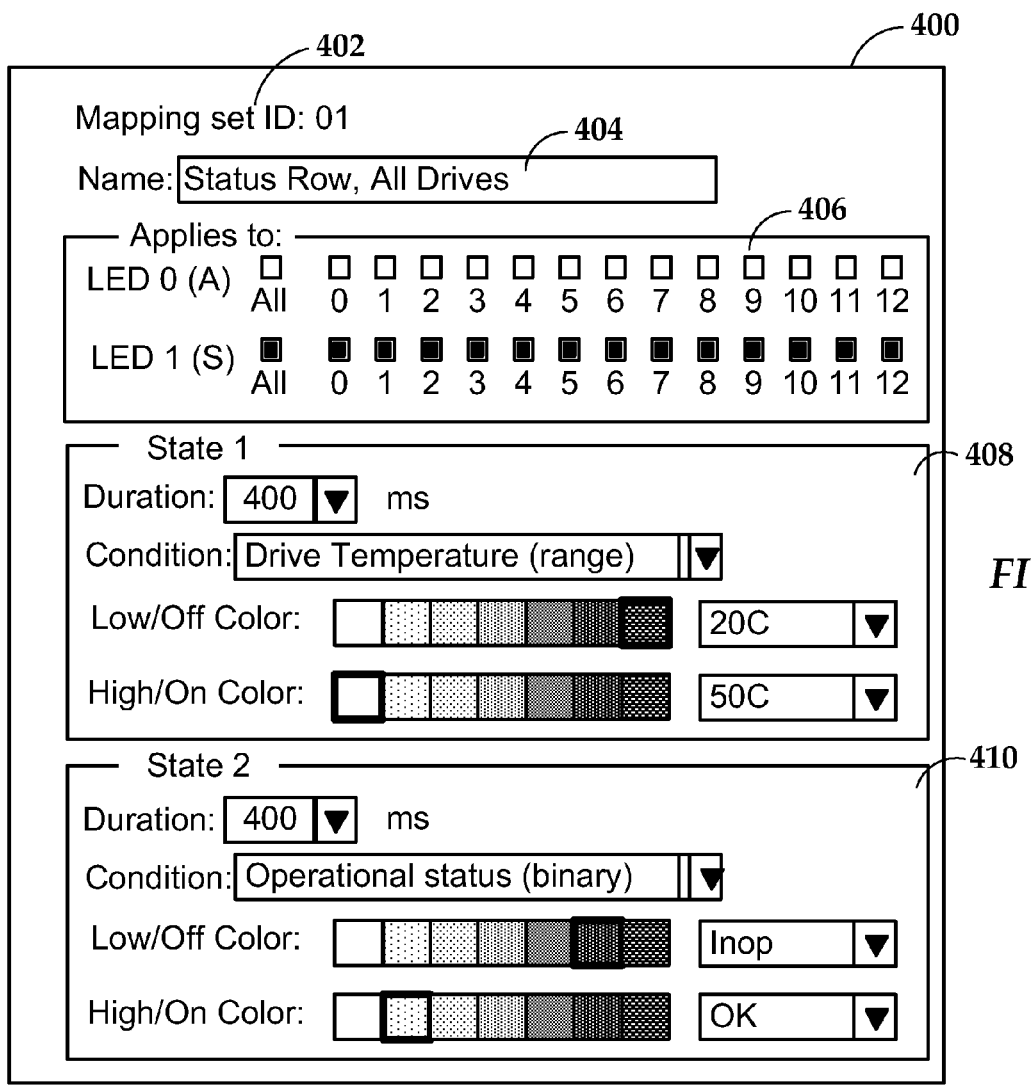
FIG. 4 is a user interface diagram that facilitates custom mapping of indicators to states according to an example embodiment.

As previously shown in FIG. 2, a user interface 204 facilitates user-customization of mapping between states/activities and LED colors/timings. In FIG. 4, a diagram illustrates a user interface 400 that facilitates custom mapping of indicators to states according to an example embodiment. Generally, a system may provide a number of mapping configurations, or mapping sets, that may apply to a subset of the drives and/or LEDs. As shown in this example, the user interface 400 is used to configure one such mapping set. The mapping set is identified by a system-defined ID 402 and a user-defined name 404. The system may ensure that the system-defined ID 402 is unique and follows internal rules (e.g., string length, allowable characters). The user-defined name 404 is intended to be user-friendly, and as such can be non-unique and with fewer restrictions on what characters may be used.

In sub-panel 406, a series of controls (e.g., checkboxes) facilitate defining which LEDs the mapping set will affect. This may assume that a selected LED is associated with a storage device, and if not default rules (e.g., LED is not lit regardless of settings, checkbox is unselectable) may apply.

As seen by the array of checkboxes in the panel 406, the current mapping set only applies to the lower row of status (S) LEDs, although the user has the option of selecting one or more of the upper row of activity (A) LEDs as well.

The LEDs may be arranged to repeatedly cycle between two or more states that each include a color and a display duration. In this example, sub-panels 408 and 410 show settings for two such states. As is evident from the "Duration:" data entry controls in sub-panels 408, 410, both states last for 400 ms. These state durations may be customizable, generally within reasonable limits (e.g., not so fast they can't be perceived, not so slow the user can't see state changes during a brief glance). The "Condition:" data entry controls in sub-panels 408, 410 facilitate selecting a status condition for the associated state.

The status condition selected in sub-panel 408 is temperature, which is an example of a variable or measurement that can vary discretely or continuously over time. For variable conditions, the user is able to define extremum (e.g., minimum and maximum) of the status condition values. In this example, the extremum are defined as a minimum of 20 C and a maximum of 50 C. Selection of a color in the color bars maps an endpoint color (e.g., hue) to each extremum value. If a status condition value is above or below the extremum, the associated indicators can take the color of the associated endpoint. If a status condition value is between the extremum, the indicator may be set to continuous or discrete colors that are calculated between the endpoints. In this way, the extremum and endpoints can be used to define a continuous or discrete color range, as well as a way to dynamically map intermediate values.

Where a status condition value is between user-defined extremum, the determination of a color may be accomplished using a numerical interpolation as is known in the art; e.g., interpolating between each R, G, and B value of the endpoint colors. Other endpoint color criteria (e.g., saturation) and/or overall intensity/brightness may be varied instead of or in addition to hue when interpolating between the two extremum. The user interface may have data validation features (e.g., warning dialogs, tool tip suggestions, selection unavailable, etc.) to help prevent the user from choosing endpoint colors that may be difficult to discern or confusing if they are selected together for use.

The status condition selected in panel 410 is operational status (OK/Inop), which is an example of a binary variable or measurement varies between one value or another over time. As such the user may be able to select between first and second binary values (e.g., on/off, 0/1, yes/no, operational/inoperational, etc.), and map an endpoint color (e.g., hue) to each binary value via color bar selection. In this case, the color range includes two discrete endpoint colors (hues). In other arrangements, other endpoint color criteria (e.g., saturation) and/or overall intensity/brightness may be changed between the two binary states.

It should be noted that although a binary condition (OK/Inop) is shown by way of example in panel 410, this may be extended to any number of different discrete conditions. For example, if a RAID array includes four storage devices, the associated LED may be configured to display an arbitrary color associated with an array location, e.g., 0: white, 1: orange, 2: blue, 3: green. The discrete colors of this color range may be arbitrarily selected (although possibly subject to validation criteria noted above) and need not be ordered across a spectrum, such as in the above examples that use interpolation.

In some arrangements, the user may be able to create custom operational status conditions. For example, the system may be able to monitor two or more different temperatures, such as media temperature, controller board temperature, case temperature, etc., for each storage device. The illustrated drive temperature in sub-panel 408 may be a user-defined combination of these different temperatures, such as an average, median, mode, maximum, minimum, etc.

The user may also be able to combine different types of state or activity conditions. For example, a temperature-to-color mapping may be red for high temperature and blue for low temperature, but the temperatures that correspond to these high and low temperatures may be altered based on current activity. In such a case, if the storage device is experiencing a temperature that would be normal under heavy use conditions, the temperature indicator may show a cool or intermediate color (e.g., blue or purple) if current use conditions are heavy, but closer to red if current use conditions are light.

Figure 5:
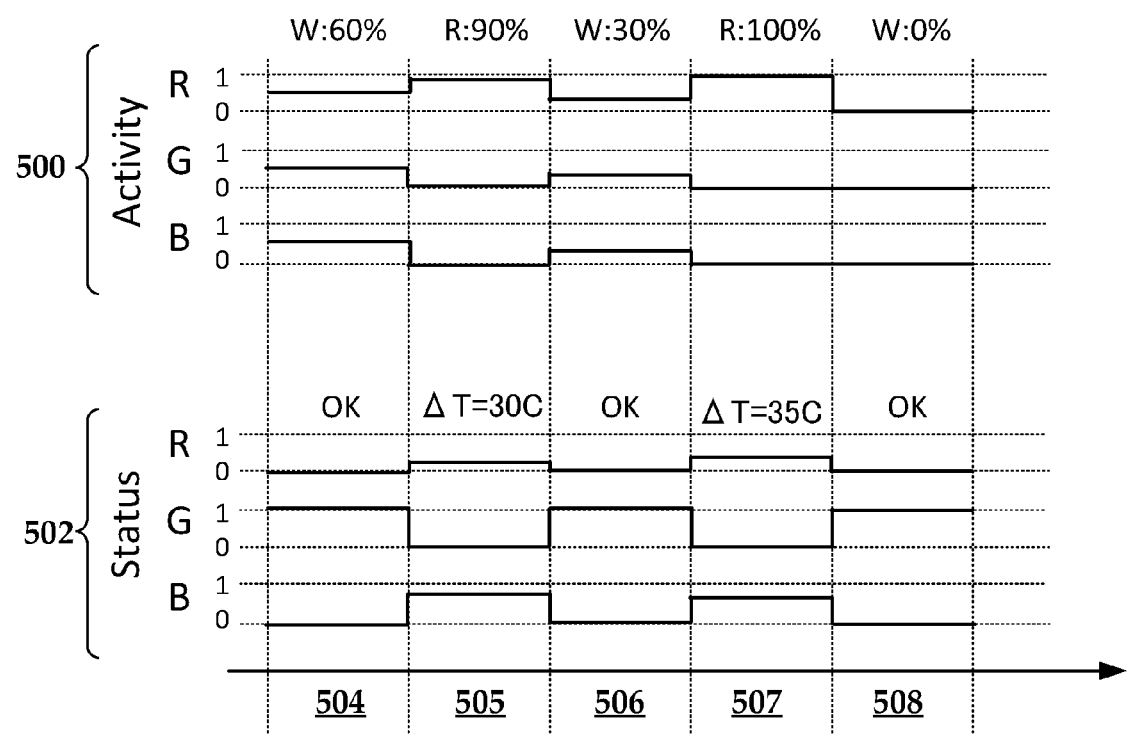
FIG. 5 is a timing diagram illustrating signals that drive indicators to different states according to an example embodiment.

In reference now to FIG. 5, a timing diagram illustrates how status conditions may be converted to signals to drive multi-color LEDs to different states according to an example embodiment. Signals 500 are applied to an activity indicator LED (e.g., an indicator of group 304 in FIG. 3) and signals 502 are applied to a status indicator LED (e.g., an indicator of group 306 in FIG. 3). The LEDs in FIG. 5 are assumed to be tri-color LEDs that utilize three signal lines, one each for red (R), green (G), and blue (B) illuminating elements. The LED will illuminate at a maximum value of the respective color if the signal line for that color is set to 1.0. The LED will not illuminate at all for the respective color if the signal applied line is 0.0.

For this example, intermediate signal values will cause intermediate illumination. The system may accomplish this by varying a voltage of each line continuously or discretely between a minimum and maximum values. The system may also vary illumination of the LED by using pulse width modulation instead of or in addition to varying of voltage.

For each LED in the example of FIG. 5, the signals form a sequence that alternates between two states during state intervals 504-508. The activity signals 500 represent a read/write activity sequence. At state intervals 504, 506, 508, the signals 500 represent a write activity status condition. At state intervals 505 and 507, the signals represent a read activity status condition. For write activity in state intervals 504, 506, 508, the LED is set to shine white (R=1.0, G=1.0, B=1.0) for 100% write activity, and black/off (R=0.0, G=0.0, B=0.0) for 0% write activity. For read activity in state intervals 505 and 507, the LED is set to shine to red (R=1.0, G=0.0, B=0.0) for 100% read activity, and black/off (R=0.0, G=0.0, B=0.0) for 0% read activity. The system may measure a number of values to determine write and read activity status conditions, e.g., size of read/write queues, percent utilization of host I/O data lines, utilization of internal I/O data lines, etc.

The status signals 502 represent an operational/temperature status sequence. At state intervals 504, 506, 508, the status LED signals 502 represent a binary (OK/Inop) operational status condition. At state intervals 505 and 507, the status LED signals 502 represent a variable temperature status condition. For operational status in state intervals 504, 506, 508, the LED is set to shine green (R=0.0, G=1.0, B=0.0) for OK/operational, and red (R=1.0, G=0.0, B=0.0) for inoperational. For temperatures status in intervals 505 and 507, the LED is set to shine to red (R=1.0, G=0.0, B=0.0) for a high temperature and blue (R=0.0, G=0.0, B=1.0) for low temperature. For the temperature status condition, the user may be able to select from a single temperature measurement or combination of temperature measurements, including media temperature, case temperature, circuit board temperature, etc.

Sequences similar to those represented by signals 500, 502 may be applied in synchronization to an array of persistent storage devices. The magnitude of the applied signals will vary according to the respective status conditions of the storage devices, but the signals may be synchronized to the same state intervals, such as example intervals 504-508 shown in FIG. 5. This synchronization of signal sequences allows a differently behaving one of the persistent storage devices to be visually distinguished from others of the array.

Figure 6:
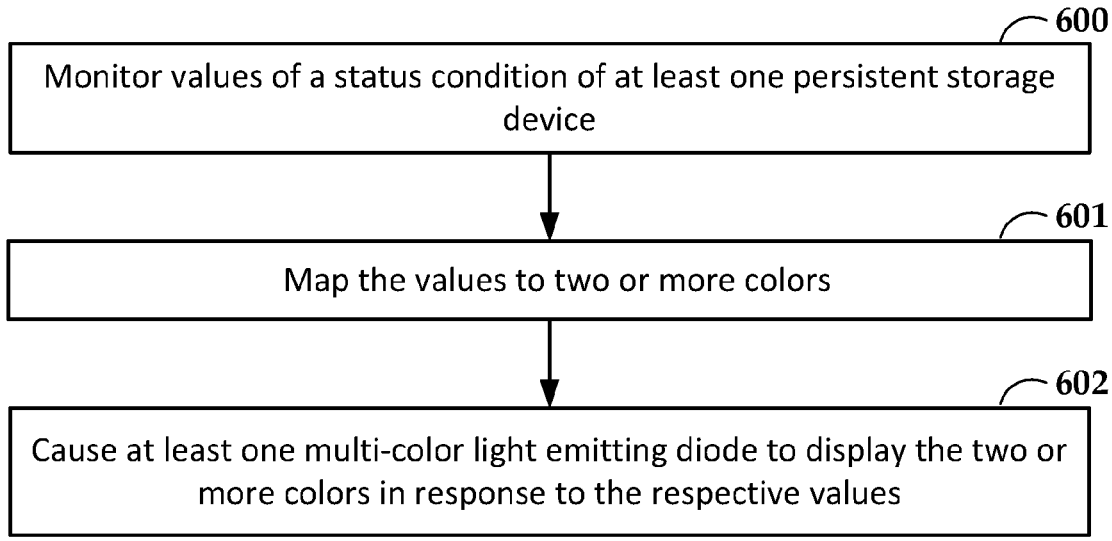
FIGS. 6 and 7 are flowcharts illustrating methods according to example embodiments.

In reference now to FIG. 6, a flowchart illustrates a method according to an example embodiment. The method involves monitoring 600 values of a status condition of at least one persistent storage device and mapping 601 the values to two or more colors. The status condition may include at least one of temperature, processor usage, data transfer level, and a failure of the persistent storage device. The method further involves causing 602 at least one multi-color LED to display the two or more colors in response to the respective values. The multi-color LED may include a tri-color LED.

The monitoring 600 may involve monitoring the status condition of an array of persistent storage devices, in which case the at least one multi-color LED may include a plurality of multi-color LEDs each associated with one of the persistent storage devices of the array. In such a case, the causing 602 of the multi-color LEDs to display the two or more colors may involve synchronizing a plurality of sequences of the array so that a differently behaving one of the persistent storage devices can be visually distinguished from others of the array.

The values of the status condition monitored at 600 may include a range of values, in which case causing 602 the at least one multi-color LED to display the two or more colors may involve interpolating between endpoint colors each mapped to an extremum of the values. The values of the status condition monitored at 600 may include binary values, in which case causing 602 the at least one multi-color LED to display the two or more colors may involve switching between endpoint colors mapped to the binary values.

Figure 7:
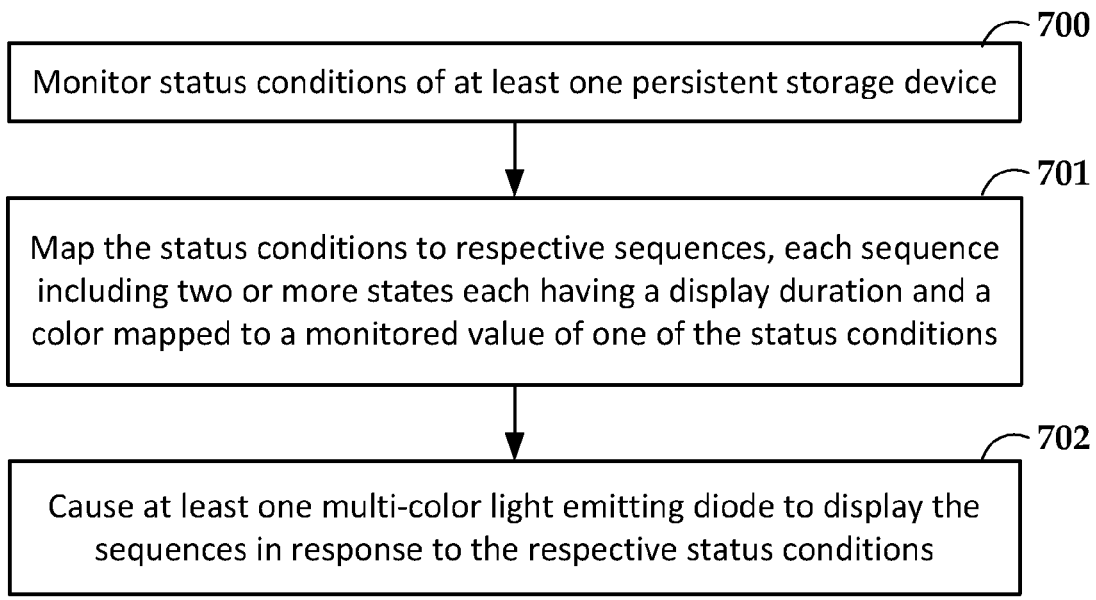

In reference now to FIG. 7, a flowchart illustrates a method according to another example embodiment. The method involves monitoring 700 status conditions of at least one persistent storage device. The status conditions may include at least one of temperature, processor usage, data transfer level, and a failure of the at least one persistent storage device. The status conditions are mapped 701 to a sequence having two or more states. Each state has a display duration and a color mapped to a monitored value of one of the status conditions. Each state may also include an intensity mapped to the monitored value.

The method further involves causing 702 at least one multi-color LED to display the sequence in response to the respective status conditions. The multi-color LED may include a tri-color LED. The causing 702 of the multi-color LED to display the sequence may involve repeating the two or more states. In one variation the monitoring of the status conditions of the at least one persistent storage device involves monitoring the status conditions of an array of persistent storage devices, in which case the multi-color LED includes a plurality of multi-color LEDs each associated with one of the persistent storage devices of the array. In such a case, causing 702 the multi-color LEDs to display the sequence in response to the respective status conditions may involve synchronizing a plurality of sequences of the array so that a differently behaving one of the persistent storage devices can be visually distinguished from others of the array.

The various embodiments described above may be implemented using circuitry and/or software modules that interact to provide particular results. One of skill in the computing arts can readily implement such described functionality, either at a modular level or as a whole, using knowledge generally known in the art. For example, the flowcharts illustrated herein may be used to create computer-readable instructions/code for execution by a processor. Such instructions may be stored on a computer-readable medium and transferred to the processor for execution as is known in the art. The structures and procedures shown above are only a representative example of embodiments that can be used to facilitate managing caching in data storage devices as described above.

The foregoing description of the example embodiments has been presented for the purposes of illustration and description. It is not intended to be exhaustive or to limit the inventive concepts to the precise form disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:

1. A method comprising:
monitoring values of a status condition of at least one persistent storage device;
mapping the values to endpoint colors that correspond to an extremum of the values of the status condition; and
causing at least one multi-color light emitting diode (LED) to display a color interpolated between the endpoint colors in response to the respective values in response to the mapping.

2. The method of claim 1, wherein the monitoring of the values of the status condition of the at least one persistent storage device comprises monitoring the status condition of an array of persistent storage devices, and wherein the at least one multi-color LED comprises a plurality of multi-color LEDs each associated with one of the persistent storage devices of the array.

3. The method of claim 2, wherein causing the multi-color LEDs to display the interpolated colors in response to the respective values comprises synchronizing a plurality of sequences of the array so that a differently behaving one of the persistent storage devices can be visually distinguished from others of the array.

4. The method of claim 1, wherein the at least one multi-color LED comprises a tri-color LED.

5. The method of claim 1, wherein the status condition comprises at least one of temperature, processor usage, data transfer level, and a failure of the at least one persistent storage device.

6. The method of claim 1, further comprising facilitating, via user interface software, user definition of data describing the mapping of the values to the endpoint colors, the data being used in causing the multi-color LED to display the color.

7. The method of claim 6, wherein the user interface software facilitates selecting between interpolating between the endpoint colors in response to the values and mapping the values to one or the other of the endpoint colors.

8. The method of claim 1, further comprising:
monitoring a second status condition of the at least one persistent storage device;
mapping values of the second status condition to two or more second colors; and
causing the at least one multi-color LED to display a sequence of a first state and a second state, the first state displaying the interpolated color in response to the first status condition and the second state displaying the two or more second colors in response to the second status condition.

9. An apparatus comprising:
a monitoring interface that monitors a first status condition of at least one persistent storage device;
a mapping module that maps values of the first status condition to two or more colors;
a driver interface capable of being coupled to at least one multi-color light emitting diode (LED), wherein the apparatus causes the at least one multi-color LED to display the two or more colors in response to the respective values; and
user interface software that facilitates user definition of data describing a mapping between the values of the status condition and the two or more colors, the data being used by the mapping module.

10. The apparatus of claim 9, further comprising a database configured to store the data describing the mapping, the ma in module data from the database.

11. The apparatus of claim 9, wherein the status condition comprise at least one of temperature, processor usage, data transfer level, and a failure of the at least one persistent storage device.

12. The apparatus of claim 9, wherein the monitoring interface monitors a second status condition of the at least one persistent storage device, wherein the mapping module is further configured to map values of the second status condition to two or more second colors; wherein the apparatus causes the at least one multi-color LED to display a sequence of a first state and a second state, the first state displaying the two or more colors in response to the first status condition and the second state displaying the two or more second colors in response to the second status condition.

13. The apparatus of claim 12, wherein the first and second states are associated with first and second display durations.

14. A method comprising:
monitoring status conditions of at least one persistent storage device;
mapping the status conditions to a sequence comprising two or more states each having a display duration and a color mapped to a monitored value of one of the status conditions; and
causing at least one multi-color light emitting diode (LED) to display the sequence in response to the respective status conditions.

15. The method of claim 14, wherein the two or more states of the sequence further comprise an intensity mapped to the monitored value.

16. The method of claim 14, wherein the at least one multi-color LED comprises a tri-color LED.

17. The method of claim 14, wherein causing the at least one multi-color LED to display the sequence comprises repeating the two or more states.

18. The method of claim 14, wherein the monitoring of the status conditions of the at least one persistent storage device comprises monitoring the status conditions of an array of persistent storage devices, and wherein the at least one multi-color LED comprises a plurality of multi-color LEDs each associated with one of the persistent storage devices of the array.

19. The method of claim 18, wherein causing the multi-color LEDs to display the sequence in response to the respective status conditions comprises synchronizing a plurality of sequences of the array so that a differently behaving one of the persistent storage devices can be visually distinguished from others of the array.

20. The method of claim 14, wherein the status conditions comprise at least one of temperature, processor usage, data transfer level, and a failure of the at least one persistent storage device.

* * * * *